United States Patent [19]
van der Poel et al.

[11] Patent Number: 5,299,216
[45] Date of Patent: Mar. 29, 1994

[54] RADIATION-EMITTING SEMICONDUCTOR DIODE

[75] Inventors: Carolus J. van der Poel; Adriaan Valster; Michael J. B. Boermans, all of Eindhoven, Netherlands

[73] Assignee: U.S. Philips Corporation, New York, N.Y.

[21] Appl. No.: 982,216

[22] Filed: Nov. 25, 1992

[30] Foreign Application Priority Data

Nov. 26, 1991 [EP] European Pat. Off. ........ 91203087.1

[51] Int. Cl.$^5$ .............................................. H01S 3/025
[52] U.S. Cl. ........................................ 372/43; 372/50; 257/14; 257/18; 257/96
[58] Field of Search ........................ 372/43, 44, 45, 46, 372/47, 48, 49, 50; 257/13, 14, 15, 18, 94, 96, 98, 103

[56] References Cited

U.S. PATENT DOCUMENTS

| | | | |
|---|---|---|---|
| 4,122,407 | 10/1978 | Van Vechten | 257/94 |
| 4,694,311 | 9/1987 | Rezek et al. | 257/96 |
| 4,747,108 | 5/1988 | Partin et al. | 257/14 |
| 4,794,606 | 12/1988 | Kondow | 372/45 |
| 4,974,231 | 11/1990 | Gomyo | 372/45 |
| 5,153,890 | 10/1992 | Bona et al. | 372/48 |

OTHER PUBLICATIONS

"AlGaInP Double Heterostructure Visible-Light Laser Diodes with a GaInP Active Layer Grown by Metalorgamic Vapor Phase Epitaxy" from K. Kobayashi et al, IEEE Journal of Quantum Electronics, vol. QE-23, No. 6, Jun. 1987.

Primary Examiner—Frank Gonzalez
Attorney, Agent, or Firm—Steven R. Biren

[57] ABSTRACT

Radiation-emitting semiconductor diodes are used inter alia in information processing systems as diode lasers or LEDs. Such a radiation-emitting semiconductor diode including an active layer situated between two cladding layers, which layers each include a mixed crystal of III-V semiconductor materials, atoms of different elements, often having a certain degree of ordering, being present on at least one sublattice. An example is an InGaP/InAlGaP diode laser which emits at 670 nm and is highly suitable for various applications. There is a particular demand for diodes which have a high maximum operating temperature at a given wavelength. According to the invention, the composition of the semiconductor material of the active layer is so chosen that this layer has a compression strain, while the atoms of the different elements have a less orderly distribution at least in the semiconductor material of the active layer. This strongly reduces the starting current, while the emission wavelength remains substantially unchanged. In a preferred embodiment, the distribution in the semiconductor materials of the cladding layers is also less orderly, which improves the confinement and thus the temperature dependence characteristics of the starting current. The maximum operating temperature of diode lasers according to the invention is considerably increased owing to a low starting current and a low temperature dependence of this starting current.

8 Claims, 2 Drawing Sheets

RADIATION-EMITTING SEMICONDUCTOR DIODE

BACKGROUND OF THE INVENTION

The invention relates to a radiation-emitting semiconductor diode comprising a semiconductor body with a semiconductor substrate of a first conductivity type on which are present at least in that order a first cladding layer of the first conductivity type, an active layer, and a second cladding layer of a second conductivity type, the active layer and the cladding layers each comprising a mixed crystal of III-V semiconductor materials, while atoms of different elements are present on at least one sublattice.

Such radiation-emitting diodes, in particular when they are constructed as lasers and when the emission wavelength is in the visible part of the spectrum, are suitable radiation sources for various applications: laser printers, optical disc systems such as Compact Disc (Video) and Digital Optical Recorders, and bar code readers. There are also numerous applications for diodes constructed as LEDs.

Such a radiation-emitting diode and such a method of manufacturing it are known from the article "AlGaInP Double Heterostructure Visible-Light Laser Diodes with a GaInP Active Layer Grown by Metalorganic Vapour Phase Epitaxy" by K. Kobayashi et al., published in IEEE Journal of Quantum Electronics, vol. QE-23, no. Jun. 6, 1987, p. 704. This describes a radiation-emitting semiconductor diode in which an active layer is present between two cladding layers on a substrate of n-GaAs. The active layer and the cladding layers each comprise a mixed crystal of III-V semiconductor materials, here a mixed crystal of InP, AlP and GaP for the cladding layers and of InP and GaP for the active layer, while on at least one sublattice, here the f.c.c. lattice of the III atoms, atoms of different elements are present, here In and$_1$Ga atoms for the active layer and In, Ga and Al atoms for the cladding layers. In the radiation-emitting diode, which is constructed as a laser here, there is a strip-shaped region which acts as a resonance cavity and within which electromagnetic radiation can be generated in the active InGaP layer in the case of current passage in the forward direction by the pn junction present. The known diode lasers are manufactured at a growing temperature of 700° C. or lower and comprise a buffer layer of GaAs. The emission wavelength is approximately 670 nm (664 to 690 nm). This means that the photoluminescence wavelength is approximately 660 nm, which corresponds to a bandgap of approximately 1.88 eV. Such a wavelength of approximately 670 nm is particularly suitable for several of the applications mentioned above.

A disadvantage of the known semiconductor diode is that its maximum operating temperature is comparatively low. This temperature depends inter alia on the value of the starting current and on the temperature dependence of the starting current. Both should be as low as possible. Typical values for the starting current density of the known diode laser are 3 to 4 kA/cm$^2$ and a typical value for T$_0$ (a high T$_0$ value implies a small temperature dependence) is 90 to 125K. The maximum operating temperature, and thus the usefulness of the known diode, especially the possibility of emitting large powers, is limited by these values.

SUMMARY OF THE INVENTION

The present invention has for its object inter alia to provide a radiation-emitting semiconductor diode—more particularly, a semiconductor diode laser—which does not have the said disadvantage, or at least to a much lesser degree, and which accordingly has a comparatively high maximum operating temperature at approximately the same emission wavelength.

The invention is based on the recognition inter alia that the envisaged object may be realized through a combination of measures whereby the starting current or the temperature dependence thereof decreases while the emission wavelength remains substantially the same.

According to the invention, a radiation-emitting semiconductor diode of the kind mentioned in the opening paragraph is for this purpose characterized in that the composition of the semiconductor material of the active layer is so chosen that this layer is under compression strain and the atoms of the different elements which are present on the one sublattice have a less orderly distribution at least in the semiconductor material of the active layer. Both the application of a compression strain and the application of a tension strain in the active layer strongly decreases the starting current density of a diode laser. The former, however, is accompanied by an emission wavelength rise, the second by an emission wavelength drop. In the semiconductor diode according to the invention, the starting current is reduced by the application of a compression strain, which implies a wavelength rise. Since the atoms of the different elements present on the one sublattice have a less orderly distribution (over that sublattice) in the semiconductor material of the active layer as compared with the known laser, however, the bandgap of the material of the active layer is widened, so that the emission wavelength is lowered again without the reduction of the starting current obtained by the presence of a compression strain being lost thereby. A reduction of the starting current is obtained in this manner, and thus an increase in the maximum operating temperature, while the wavelength has changed to a much lesser extent than if, for example, exclusively compression or tension strain had been applied.

A particularly favourable embodiment arises in that the value of the compression strain and the degree of disorderliness of the said distribution are mutually attuned: when they are attuned in a suitable manner, a diode laser is obtained whose emission wavelength has not or substantially not been changed, and is therefore equal or substantially equal to that of the known laser.

A preferred embodiment of a diode laser according to the invention is characterized in that the atoms of the different elements which are present on the one sublattice have a less orderly distribution also in the semiconductor materials of the cladding layers. The bandgap of the semiconductor material of the cladding layers is widened by this. As a result, the difference in bandgap between the cladding layers and the active layer is increased while the emission wavelength remains the same, i.e. the bandgap of the semiconductor material of the active layer remains the same. The better confinement obtained in this way results in a considerably lower temperature dependence of the starting current of the laser. In this particularly favorable modification, therefore, the maximum operating temperature is improved not only by a low starting current but also by a low temperature dependence of this starting current, which renders this diode laser very attractive.

Preferably, the substrate comprises GaAs, the active layer InGaP or InAlGaP, and the cladding layers InAlGaP with a higher aluminum content than the active layer. Such diodes are highly suitable for the applications mentioned earlier. In the case of a diode laser in the InGaP/InAlGaP material system, the provision of a maximum disorder will increase the bandgap of each of the said materials by approximately 100 meV. The maximum compression strain which yields an increase in the emission wavelength corresponding thereto (=narrowing of the bandgap of the active layer) in this material system corresponds to an increase of the lattice constant of approximately 1%, which increase is obtained in that the indium content of approximately 50 atom % is raised to approximately 60 atom %. Diode lasers according to this modification and having a length of approximately 1000 μm are found to have a very low starting current density of approximately 0.35 kA/cm$^2$ and a very high $T_0$ of approximately 190K when both the active layer and the two cladding layers have a substantially maximum disorderly distribution. This results in a maximum operating temperature which is considerably higher than that of the known diode lasers.

A further improvement is obtained through the use of one or several, preferably at least two, quantum well (QW) layers in the active layer. When these QW layers have a thickness of at least approximately 6 nm, preferably approximately 8 nm, the emission wavelength is influenced by this to only a comparatively small extent. This means that the influence on the wavelength lies (well) within the latitude offered by the maximum admissible compression and the maximum possible disorder allowed in practice. An advantage of such QW layers is a lower load of the mirrors present at a diode laser. A further advantage is that they are comparatively easy to manufacture. To prevent defects arising in strained layers, there is an upper limit for the thickness of the QW layer or layers used. The following rule of thumb roughly applies: total thickness of QW layers×relative mismatch of QW layers<100 Å∗ %. This formula also gives an upper limit for the strain.

A less orderly distribution of the atoms of the different elements present on the one sublattice may be obtained in the InGaP/InAlGaP material inter alia through the use of a semiconductor substrate having an orientation deviating from the (001) orientation. A further embodiment accordingly is characterized in that the semiconductor substrate has an orientation deviating from the (001) orientation, for example, a (511) or (311) orientation, or a misorientation relative to the (001) orientation of at least 6 degrees.

In addition, such a distribution in the said material system may be realized through a suitable choice of the growing conditions, such as growing temperature and V/III ratio. The degree of disorder of the said distribution can be adjusted for each semiconductor layer separately by this method. Obviously, the degree of disorder may also be chosen to be the same for all semiconductor layers with this method, or at least for the active layer and the two cladding layers, just as with the methods mentioned earlier. An increasing disorder in the distribution is observed at a growing temperature of more than 700° C., which distribution is substantially completely disorderly at a growing temperature of at least approximately 750° C. The growing temperature is an easily controllable quantity and is accordingly attractive as a means for influencing the degree of disorder of the distribution. An attractive modification of a semiconductor diode according to the invention and in the said material system is characterized in that a buffer layer of AlGaAs having a sufficiently high aluminium content is present between the semiconductor substrate and the first cladding layer. It was found necessary to use such a buffer layer in order to be able to grow semiconductor layers of a sufficiently good morphology at the said increased growing temperatures. The necessary aluminum content depends on the level of the growing temperature and is at least approximately 6 atom %.

BRIEF DESCRIPTION OF THE DRAWING

The invention will now be explained in more detail with reference to an embodiment and the accompanying drawing, in which.

Figure 1:
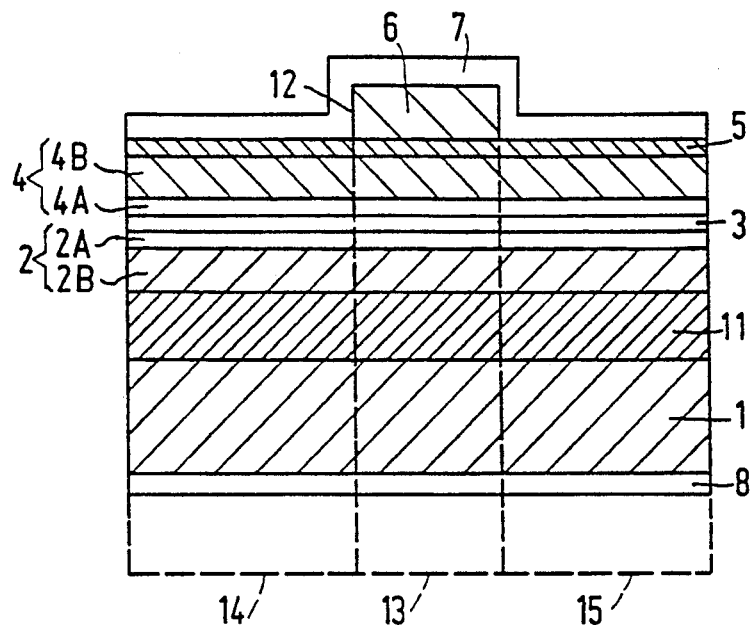
FIG. 1 shows an embodiment of a radiation-emitting semiconductor diode according to the invention in cross-section.

The Figures are diagrammatic and not drawn to scale, the dimensions in the thickness direction being particularly exaggerated for greater clarity. Corresponding parts are given the same reference numerals in the various Figures as a rule. Semiconductor regions of the same conductivity type are hatched in the same direction as a rule.

DESCRIPTION OF THE PREFERRED EMBODIMENTS

FIG. 1 shows in cross-section a first embodiment of a radiation-emitting semiconductor diode according to the invention. The semiconductor diode comprises a semiconductor body 10 with a substrate region 1 of a first, here the n-conductivity type provided with a connection conductor 8 and in this example consisting of monocrystalline gallium arsenide. A semiconductor layer structure is provided on this, comprising inter alia a first cladding layer 2 of n-InAlGaP, an active layer 3 of InGaP, and a second cladding layer 4 of p-InAlGaP. These semiconductor layers 2, 3, and 4 each comprise a mixed crystal of III-V semiconductor materials in which atoms of different III elements are present on at least one sublattice, in this case the sublattice for the atoms of the III elements. On the second cladding layer are present an intermediate layer 5 of InGaP and a contact layer 6 of GaAs which forms a mesa-shaped strip 12, both also of the opposite, so here the p-conductivity type. A conducting layer 7 is provided over the mesa-shaped strip 12, which layer provides a good, substantially ohmic contact with the layer 6 and which forms a junction, constituting a barrier, with the subjacent intermediate layer 5 outside the strip 12. As a result, no or substantially no current runs through the regions 13 and 14 in the semiconductor body next to the mesa-shaped strip 12 below a certain voltage when the conducting layers 7 and 8 are included in a current circuit. According to the invention, the composition of the semiconductor material of the active layer 3, here made of InGaP, is so chosen that this layer 3 is under compression strain, and the atoms of the different elements present on the one sublattice, in this case In and Ga atoms, have a less orderly distribution at least in the semiconductor material of the active layer 3. The starting current of the diode laser is considerably reduced by this, while the emission wavelength has hardly changed relative to that of the known diode laser (670 nm). The usefulness of such a diode has been increased by this: the maximum operating temperature and the maximum output power are much higher. The compression strain and the degree of disorder were so chosen in this example that the emission wavelength is substantially equal to that of the known laser, i.e. approximately 670 nm. The compression strain is achieved by means of a 1% greater lattice constant as compared with the GaAs substrate. For this purpose, the active layer 3 comprises approximately 60 atom % indium instead of approximately 50 atom % as in the known diode laser. The distribution of the III elements, here In and Ga, is substantially completely disorderly in the active layer 3, so that the bandgap would have decreased by approximately 100 meV if the compression strain were absent. The atoms of the different elements, here In, Ga and Al atoms, present on the one sublattice have a less orderly or substantially completely disorderly distribution also in the semiconductor materials of the cladding layers 2, 4, which are made of InAlGaP in the present example. As a result, the bandgap of the cladding layers 2, 4 is increased and the confinement has been much improved since the bandgap of the active layer 3 has remained substantially unchanged. The temperature dependence of the starting current of the radiation-emitting diode in this example is as a result lower than that of the known diode, which further increases the maximum operating temperature. Furthermore, a buffer layer 11 of AlGaAs with an aluminium content of approximately 20 atom % is present between the substrate region 1 and the first cladding layer 2. As a result, the layers present above the buffer layer 11 may be provided at a comparatively high growing temperature, in this example 760° C., without the crystal quality deteriorating, while the distribution of the III elements over the first sublattice in these layers has the most disorderly character possible thanks to this high temperature. In this example, the cladding layers 2 and 4 comprise sub-layers 2B and 4B comprising $In_{0.5}Al_{0.35}Ga_{0.15}P$ and sub-layers 2A and 4A (the so-called separate confinement layers) comprising $In_{0.5}Al_{0.15}Ga_{0.35}P$, while the active layer 3 comprises a single quantum well layer comprising $In_{0.62}Ga_{0.38}P$ and is approximately 10 nm thick. Thanks to the comparatively great thickness of the quantum well layer 3, the mirror load is comparatively low while the emission wavelength is hardly influenced. Within the semiconductor body 10 there is a strip-shaped region 13 of which the mesa-shaped strip 12 forms part and within which a pn-junction is present which causes the emission of electromagnetic radiation if there is a sufficient current strength in the forward direction. Since the conducting layer 7 has good electrical contact with the contact layer 6, the region 13 forms a preferred path for the electric current. The radiation-emitting semiconductor diode is constructed as a diode laser in this example, more particularly of the gain-guided type. This means that the emission is coherent at a sufficiently high current strength. In view of the diode laser construction, the mesa-shaped strip 12 is bounded perpendicularly to the longitudinal direction by two mutually parallel mirror surfaces which lie in the plane of the drawing and which coincide with natural cleaving surfaces of the crystal from which the semiconductor body was formed. As a result, a resonance cavity for the generated radiation is formed within the strip-shaped region 13 in the active layer 3. The following compositions, doping levels, and thicknesses were used for the various semiconductor layers in the present example.

| Layer | Semiconductor | Type | Doping concentr. (at/cm$^2$) | Thickness ($\mu$m) | Bandgap (eV) |
| --- | --- | --- | --- | --- | --- |
| 1 | GaAs (substrate) | N | $2 \times 10^{18}$ | 350 | 1.4 |
| 11 | $Al_{0.2}Ga_{0.8}As$ | N | $2 \times 10^{18}$ | 0.1 | 1.7 |
| 2B | $In_{0.5}Al_{0.35}Ga_{0.15}P$ | N | $5 \times 10^{17}$ | 0.8 | 2.3 |
| 2A | $In_{0.5}Al_{0.15}Ga_{0.35}P$ | — | — | 0.08 | 2.15 |
| 3 | $In_{0.6}Ga_{0.4}P$ | — | — | 0.01 | 1.88 |
| 4A | $In_{0.5}Al_{0.15}Ga_{0.35}P$ | — | — | 0.08 | 2.15 |
| 4B | $In_{0.5}Al_{0.35}Ga_{0.15}P$ | P | $3 \times 10^{17}$ | 0.8 | 2.3 |
| 5 | $In_{0.5}Ga_{0.5}P$ | P | $1 \times 10^{18}$ | 0.1 | 1.9 |
| 6 | GaAs | P | $2 \times 10^{18}$ | 0.5 | 1.4 |

The width of the mesa-shaped strip 12 is approximately 7 $\mu$m and its length is approximately 300 $\mu$m. The conducting layer 8 on the substrate 1 in this example is a gold-germanium-nickel layer with a thickness of approximately 1000 Å. The conducting layer 7 in this example is a platinum layer, a tantalum layer and a gold layer with thicknesses of approximately 1000, approximately 500 and approximately 2500 Å.

Figure 2:
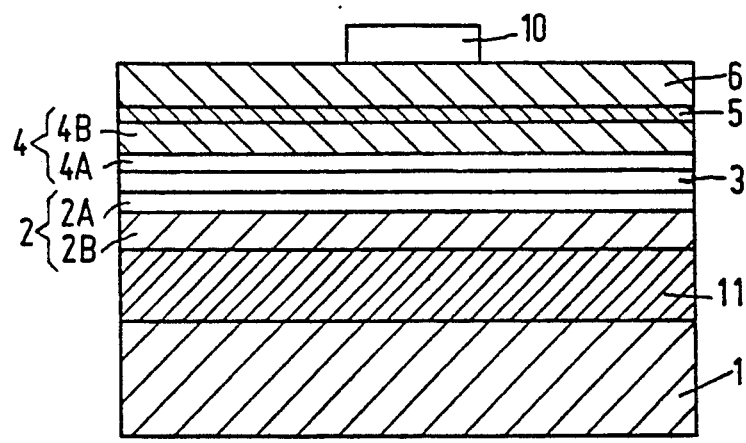
FIGS. 2 and 3 show the radiation-emitting semiconductor diode of FIG. 1 in cross-section in consecutive stages of manufacture.
Figure 3:
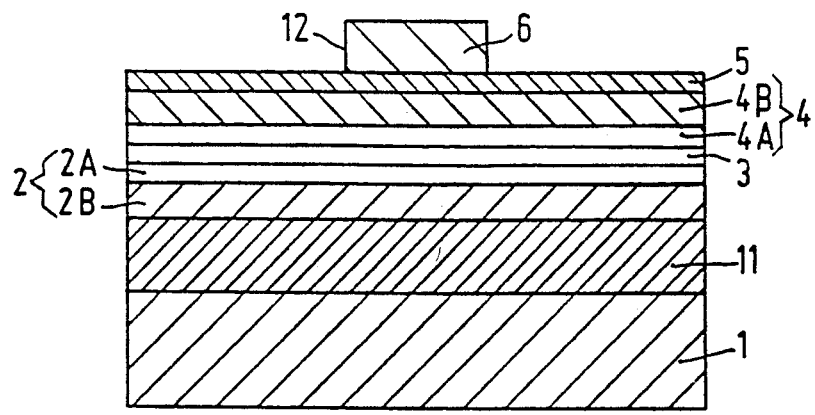

The radiation-emitting semiconductor diode described is manufactured as follows (see FIGS. 2 and 3). The starting material is a (001) substrate 1 of monocrystalline n-type gallium arsenide. After polishing and etching of the surface having the (001) orientation, first a 0.1 $\mu$m thick layer 11 of n-type AlGaAs with an aluminium content of 20 atom % is provided on this surface, for example, from the gas phase by means of OMVPE (=Organo Metallic Vapor Phase Epitaxy) at a growing temperature of 760° C. The comparatively high temperature of approximately 760° C. has the result that the III elements of the layers following the buffer layer 11 are distributed substantially completely disorderly over the relevant sublattice. After that, a first cladding layer 2 of InAlGaP, an active layer 3 of InGaP, a second cladding layer 4 of InAlGaP, an intermediate layer 5 of InGaP, and a contact layer 6 of GaAs are provided, the cladding layers 2 and 4 each comprising two sub-layers 2A, 2B and 4A, 4B. Composition, conductivity type, doping concentration, thickness, and bandgap of each semiconductor layer are given in the Table included above. After the structure has been taken from the growing apparatus, a 1 $\mu$m thick masking layer 10 is provided thereon, for example, of photoresist in the form of a strip whose longitudinal axis is at right angles to the plane of the drawing of FIG. 2, which is a diagrammatic cross-section perpendicular to the longitudinal direction of the resulting structure.

Subsequently, a mesa-shaped strip 12 (see FIG. 3) is etched into the semiconductor layer structure of FIG. 2, the GaAs contact layer 6 being locally removed by means of an etchant comprising $NH_3$, $H_2O_2$ and $H_2O$ in the ratio 2:1:50, the etching rate at room temperature being approximately 0.7 $\mu$m/min. The subjacent $In_{0.5}Ga_{0.5}P$ intermediate layer 5 serves as an etching stopper layer during this. After removal of the mask 10 and cleaning of the structure thus obtained, a conducting layer 8 is provided on the substrate, for example by means of sputtering, for example consisting of a gold-germanium-nickel layer with a thickness of approximately 1000 Å (see FIG. 1). Finally, a conducting layer 7 is provided over the upper surface of the structure, for example by the same technique, for example consisting of a platinum layer, a tantalum layer and a gold layer whose thicknesses are approximately 1000, approximately 500 and approximately 2500 Å, respectively. After cleaving, the individual radiation-emitting semiconductor diodes, in this case diode lasers of the gain-guided type, are available for final mounting.

Figure 4:
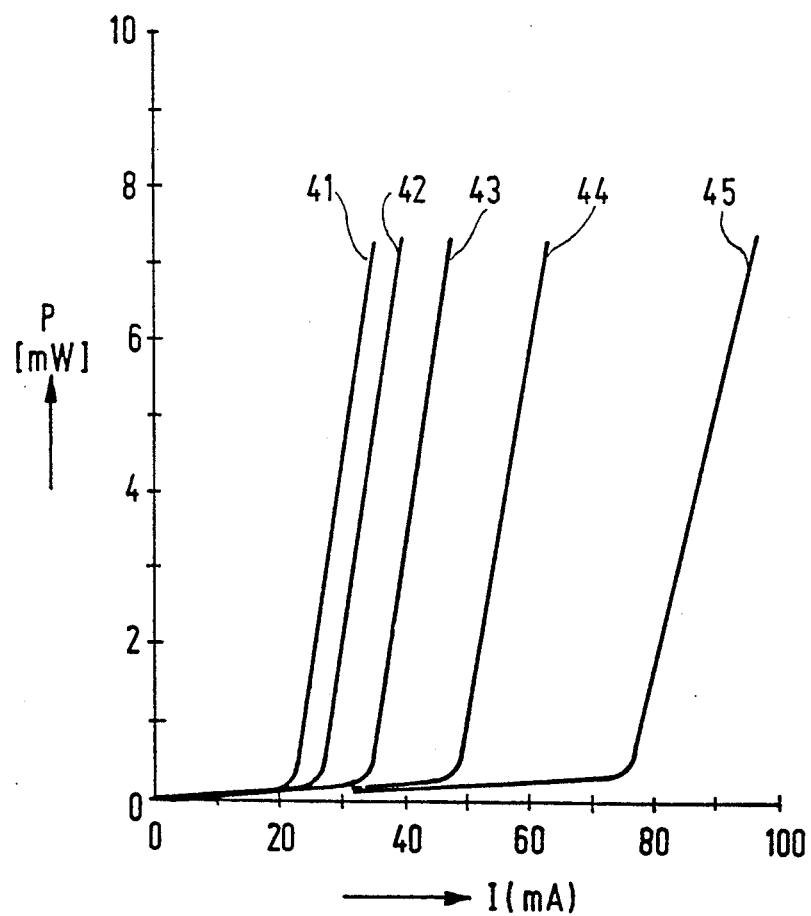
FIG. 4 shows the light output plotted against the current of a radiation-emitting semiconductor diode according to the invention for various temperatures.

FIG. 4 shows the light output (P) plotted against the current (I) through a radiation-emitting semiconductor diode according to the present example. The curves 41, 42, 43, 44 and 45 show the results at temperatures of 20°, 40°, 60°, 80° and 100° C., respectively. The diode laser according to the invention has a low starting current (20 mA at 20° C.), which corresponds to a starting current density of 0.6 kA/cm$^2$. The $T_0$ of this diode laser is approximately 70K, while the length of the diode laser is 300 μm. A still better result was obtained with a semiconductor diode laser as described in the example but with a small modification: the active layer 3 comprised, instead of one QW, two QWs with a thickness and composition as indicated in the Table above. The QWs were separated from one another by a 6 nm thick $Al_{0.2}Ga_{0.3}In_{0.5}P$ barrier layer. The component parts 2A and 4A of the cladding layers 2, 4 also had the composition $Al_{0.2}Ga_{0.3}In_{0.5}P$. These laser diodes, which also emitted at approximately 670 nm, showed a very low starting current density of 0.35 kA/cm$^2$ and a particularly low temperature dependence of the starting current, manifesting itself in the very high so-called $T_0$ value of approximately 190K, measured between 300 and 360K and for a laser length of 1000 μm. The result is that the diodes according to the invention have a very high maximum operating temperature and are capable of providing a comparatively high power.

The invention is not limited to the embodiments given, since many modifications and variations are possible to those skilled in the art within the scope of the invention. Thus other compositions of the selected semiconductor materials than those mentioned in the example may be used: radiation-emitting semiconductor diodes whose active layers comprise InAlGaP may alternatively be used. The conductivity types may also be all replaced (simultaneously) by their opposites. As to the maximum growing temperature, it is noted that an even more disorderly distribution is found at 790° C. than at approximately 760° C., but that problems involving the morphology of the semiconductor layers arise at 790° C. Depending on the application, one may opt for an LED version or a laser version of a radiation-emitting semiconductor diode according to the invention. Both a gain-guided and an index-guided structure may be used within the laser version. Finally, it should be noted that the methods of providing the semiconductor layers used in the embodiments may also be other methods than the MOVPE technique. Instead of MOVPE, MOMBE (=Metal Organic Molecular Beam Epitaxy), MBE (=Molecular Beam Epitaxy) or VPE (=Vapor Phase Epitaxy) may alternatively be used.

We claim:

1. A radiation-emitting semiconductor diode comprising a semiconductor body with a semiconductor substrate of a first conductivity type on which are present at least in that order a first cladding layer of the first conductivity type, an active layer, and a second cladding layer of a second conductivity type, the active layer and the cladding layers each comprising a mixed crystal of III-V semiconductor materials, while atoms of different elements are present on at least one sublattice, characterized in that the composition of the semiconductor material of the active layer is so chosen that this layer is under compression strain and the atoms of the different elements which are present on the one sublattice have a less orderly distribution at least in the semiconductor material of the active layer.

2. A radiation-emitting semiconductor diode as claimed in claim 1, characterized in that the degree of disorder in the distribution and the value of the compression strain are chosen in such a way that the emission wavelength of the semiconductor diode remains substantially unchanged.

3. A radiation-emitting semiconductor diode as claimed in claim 1, characterized in that the atoms of the different elements which are present on the one sublattice have a less orderly distribution also in the semiconductor materials of the cladding layers.

4. A radiation-emitting semiconductor diode as claimed in claim 1, characterized in that the substrate comprises GaAs, the active layer consists of a material selected from InGaP and InAlGaP, and the cladding layers comprise InAlGaP with a higher aluminum content than that of the active layer.

5. A radiation-emitting semiconductor diode as claimed in claim 4, characterized in that the active layer comprises InGaP with an indium content of approximately 60 atom %, and in that the distribution is substantially completely disorderly both in the active layer and in the cladding layers.

6. A radiation-emitting semiconductor diode as claimed in claim 1, characterized in that the active layer comprises at least one quantum well layer whose thickness is at least approximately 6 nm.

7. A radiation-emitting semiconductor diode as claimed in claim 1, characterized in that the substrate has an orientation deviating from the (001) orientation or a misorientation relative to the (001) orientation of at least 6 degrees.

8. A radiation-emitting semiconductor diode as claimed in claim 1, characterized in that a buffer layer of AlGaAs is present between the substrate and the first cladding layer.

* * * * *